US011824524B2

(12) United States Patent
Nagatomi et al.

(10) Patent No.: US 11,824,524 B2
(45) Date of Patent: Nov. 21, 2023

(54) SEMICONDUCTOR DEVICE

(71) Applicant: RENESAS ELECTRONICS CORPORATION, Tokyo (JP)

(72) Inventors: Hiroki Nagatomi, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/708,862

(22) Filed: Mar. 30, 2022

(65) Prior Publication Data

US 2023/0318595 A1 Oct. 5, 2023

(51) Int. Cl.
*H03K 17/14* (2006.01)
*G01K 7/01* (2006.01)
(Continued)

(52) U.S. Cl.
CPC ....... *H03K 17/145* (2013.01); *B60R 16/0207* (2013.01); *G01K 7/01* (2013.01);
(Continued)

(58) Field of Classification Search
CPC ............... H03K 17/145; H03K 17/063; B60R 16/0207; G01K 7/01; G01K 7/22; G01K 7/42; G01K 15/007; G01K 1/08; G01K 3/005; G01K 3/14; G01K 1/026; G01K 1/14; G05F 3/26; H03F 3/45; H03F 2200/351; H03F 2200/78; H03F 3/217;
(Continued)

(56) References Cited

U.S. PATENT DOCUMENTS 5,604,463 A * 2/1997 Freuler ................. H03F 3/3076
330/297
5,869,878 A 2/1999 Hasegawa
(Continued)

FOREIGN PATENT DOCUMENTS

JP          08-213441 A      8/1996
JP          2016-072935 A    5/2016

OTHER PUBLICATIONS

M. Janicki, T. Torzewicz, Z. Kulesza, A. Napieralski, Accuracy and boundary condition independence of Cauer RC ladder compact thermal models, Microelectronics Journal, vol. 44, Issue 7, 2013, pp. 619-622, ISSN 0026-2692 (Year: 2013).*

*Primary Examiner* — John W Poos
*Assistant Examiner* — Tyler J Pereny
(74) *Attorney, Agent, or Firm* — McDermott Will & Emery LLP

(57) ABSTRACT

A semiconductor device includes a first transistor that flows a load current to an external load; a current generation circuit that outputs a current corresponding to a power consumption generated in an overheat detection target when the load current flows the overheat detection target; a resistor-capacitor-network comprising a resistor and a capacitor corresponding to a thermal resistance and a thermal capacitance of the overheat detection target, and having one end coupled to the current generation circuit; an overheat detection circuit coupled to a connection point of the current generation circuit and the resistor-capacitor-network; and a voltage source that sets a voltage of the connection point of the current generation circuit and the resistor-capacitor-network to a predetermined voltage.

18 Claims, 10 Drawing Sheets

(51) Int. Cl.
*G05F 3/26* (2006.01)
*H03K 17/06* (2006.01)
*H03F 3/45* (2006.01)
*B60R 16/02* (2006.01)

(52) U.S. Cl.
CPC ............ *G05F 3/26* (2013.01); *H03F 3/45* (2013.01); *H03K 17/063* (2013.01)

(58) Field of Classification Search
CPC ............ H03F 1/3211; H03F 2200/294; H03F 2200/408; H03F 2203/21139; H03F 2203/45024; H03F 2203/45058; H03F 2203/45638; H03F 2203/45652; H03F 3/193; H03F 3/211; H03F 3/245; H03F 3/45179; H03F 3/45188; H03F 3/4521; H03F 1/0205; H03F 2200/234; H03F 2203/45682; H03F 3/2173; H03F 3/302; H03F 3/45219; H05B 47/105; H05B 39/04; H05B 45/56; H05B 39/041; G01R 21/133; G01R 1/203; G01R 19/0092; G01R 19/32; G01R 21/02; G01R 31/006; G01R 31/26; G01R 31/3004; G01R 19/16576; G01R 19/22; G01R 19/2503; G01R 31/007; G01R 31/2628; H02P 7/28; H02P 29/68; H02J 7/0031; H02J 7/00308

See application file for complete search history.

(56) References Cited

U.S. PATENT DOCUMENTS

| | | | |
|---|---|---|---|
| 9,673,803 B2 | 6/2017 | Uemura et al. | |
| 2016/0218501 A1* | 7/2016 | Eddleman | H01C 1/16 |
| 2019/0028095 A1* | 1/2019 | Sanchez | H02M 3/07 |
| 2020/0333196 A1* | 10/2020 | Zanbaghi | G01K 7/01 |

* cited by examiner

SEMICONDUCTOR DEVICE

BACKGROUND

The present invention relates to a semiconductor device, particularly a semiconductor device having a power semiconductor.

THE BACKGROUND OF THE INVENTION

In order to drive a load, e.g. a motor, a heater and a lamp or the like mounted on an automotive, a power semiconductor device is used. As the power semiconductor device, a power MOSFET or an IGBT (Insulated Gate Bipolar Transistor) is used. And, for miniaturization and cost reduction of a final product, a device called IPD (Intelligent Power Device) in which a power MOSFET chip and a control chip (including protective circuit) are mounted in one package is also used. In these semiconductor devices, an overheat protection measure using a temperature sensor such as a diode has become important.

Patent Document 1 discloses a technique for reducing a thermal resistance between the target element for temperature sensing and the temperature sensing diode. Specifically, the temperature sensing diode is formed at a position surrounded by the target element for temperature sensing. Further, it is disclosed that the temperature of the target element for temperature sensing is determined by first-order approximate calculation or second-order approximate calculation depending on the distance from the temperature sensing diode.

Patent Document 2 discloses a technique for detecting the overtemperature of an output transistor by a diode D2 disposed in the vicinity of the output transistor, and a diode D1 disposed in the peripheral circuit region away from the output transistor.

PRIOR-ART DOCUMENT

Patent Document

[Patent Document 1] Japanese Unexamined Publication Laid-Open No. 8-213441
[Patent Document 2] Japanese Unexamined Publication Laid-Open No. 2016-72935

SUMMARY

Between the semiconductor device and the load described above is connected by a wire harness. The wire harness also generates heat by the current flows, and when it becomes high heat the wire harness is melted. It is required to monitor not only the temperature of the semiconductor device but also the heat of the external load including the wire harness.

Other objects and novel features will become apparent from the description of the specification and drawings.

A semiconductor device according to an embodiment includes a first transistor that flows a load current to an external load; a current generation circuit that outputs a current corresponding to a power consumption generated in an overheat detection target when the load current flows the overheat detection target; a resistor-capacitor-network comprising a resistor and a capacitor corresponding to a thermal resistance and a thermal capacitance of the overheat detection target, and having one end coupled to the current generation circuit; an overheat detection circuit coupled to a connection point of the current generation circuit and the resistor-capacitor-network; and a voltage source that sets a voltage of the connection point of the current generation circuit and the resistor-capacitor-network to a predetermined voltage.

According to the present invention, it is possible to detect overheating with high accuracy.

DETAILED DESCRIPTION

Figure 1:
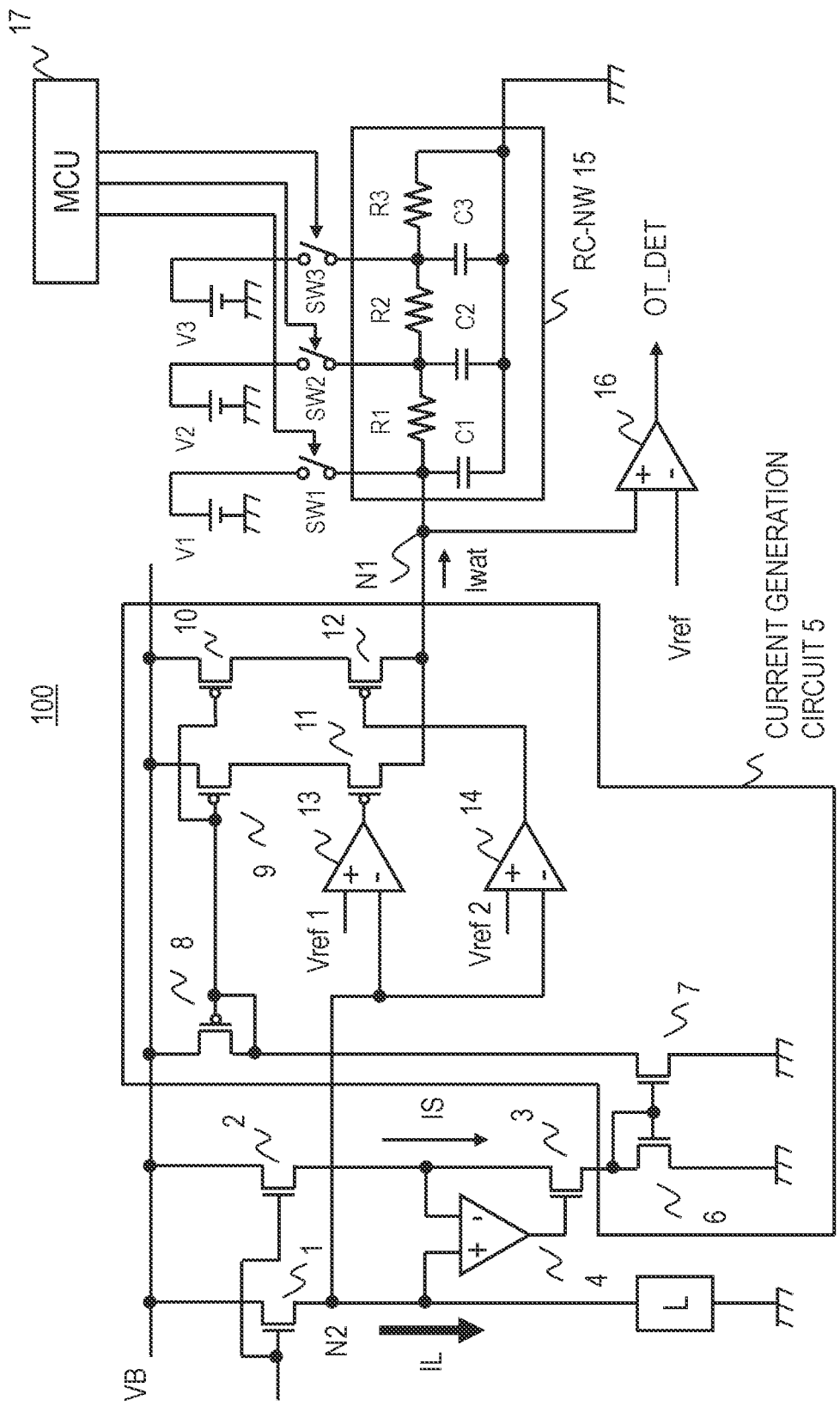
FIG. 1 is a circuit diagram of a semiconductor device according to a first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a circuit diagram of a semiconductor device 100 according to the first embodiment. The semiconductor device 100 includes N-channel transistors 1 to 3, a differential amplifier 4, a current generation circuit 5, a resistor-capacitor-network (RC-NW) 15, an overheat detection circuit (comparator) 16, a voltage source (V1, V2, V3). VB is, for example, a power supply voltage supply line, and the power supply voltage is supplied from the battery. Transistor 1 is a power MOSFET (also referred to as a main-MOS) for driving the load L. Load L is coupled to a source of the main MOS 1 via a wire harness. Transistor 2 is coupled in parallel with the main MOS 1 and is a power MOSFET (also referred to as a sense MOS) for detecting the current flowing in the main MOS 1. The sense MOS 2 has the same cell structure as the main MOS 1 but differs in cell counts. A common control signal is coupled to the gates of the main MOS 1 and sense MOS 2. A source of the sense MOS 2 is coupled to a drain of the transistor 3. A non-inverting input terminal of the differential amplifier 4 is coupled to the source of the main MOS 1, and an inverting input terminal thereof is coupled to the source of the sense MOS 2. The output of differential amplifier 4 is coupled to the gate of transistor 3.

The current generation circuit 5 includes N-channel transistors 6, 7, P-channel transistors 8-12, comparators 13, 14. Transistors 6 and 7 constitute a first current mirror circuit. The drain of the transistor 6 is coupled to the source of the transistor 3. Transistors 8-10 constitute a second current mirror circuit and are coupled to the first current mirror circuit. The second current mirror circuit is configured such that a ratio of currents flowing through the transistors 9 and 10 is 1:1. The drain of the transistor 9 is coupled to the source of the transistor 11. The drain of the transistor 10 is coupled to the source of the transistor 12. The inverting input terminal of the comparator 13 is coupled to the source of the main MOS 1 (node N2), and the non-inverting input terminal thereof is coupled to a reference voltage Vref 1. The output of comparator 13 is coupled to the gate of transistor 11. The inverting input terminal of the comparator 14 is coupled to the source of the main MOS 1 (node N2), and the non-inverting input terminal thereof is coupled to a reference voltage Vref 2. The output of comparator 14 is coupled to the gate of transistor 12.

The output of the second current mirror circuit (node N1) is coupled to one end of the resistor-capacitor-network (RC-NW) 15.

The other end of the resistor-capacitor-network RC-NW 15 is coupled to the ground.

The node N1 is coupled to the overheat detection circuit (comparator) 16. Reference voltage Vref is coupled to the inverting input terminal of the comparator 16.

Resistor-capacitor-network 15 is a Cauer type equivalent circuit in which the overheat detection target is circuitized. In the first embodiment, the resistors R1, R2, R3 capacitors C1, C2, C3 constituting the resistor-capacitor-network 15 correspond to the thermal resistance and thermal capacitance of the external load including the wire harness coupled to the semiconductor device 100. Since Cauer equivalent circuit is generally known, its detailed description is omitted.

Furthermore, a connecting point of the capacitor C1 and the resistor R1 is coupled to a voltage source V1 via a switch SW1.

A connecting point of the capacitor C2 and the resistor R2 is coupled to a voltage source V2 via a switch SW2. A connecting point of the capacitor C3 and the resistor R3 is coupled to a voltage source V3 via a switch SW3. The switches SW1 to SW3 are controlled by a Micro Controller Unit (MCU).

Next, an operation of the semiconductor device 100 according to the first embodiment will be described with reference to FIG. 1. First, control voltages are applied to the gates of the main MOS 1 and sense MOS 2 to cause the semiconductor device 100 to perform the desired operation. The control of the gate voltage, for example, is performed using a PWM (Pulse Width Modulation) scheme by MCU 17. When a control voltage is applied to the gate, a load current IL flows in the main MOS 1. The differential amplifier 4 and transistor 3 control the sense current IS so that the source voltage of the main MOS 1 and the source voltage of the sense MOS 2 are equal. As a result of this control, the sense current IS becomes a current corresponding to the sense ratio of the main MOS 1 and the sense MOS 2 (e.g., 1000:1) with respect to the load current IL.

Next, an operation of the current generation circuit 5 will be described. Sense current IS becomes the drain currents of the transistors 9 and 10 by the first and second current mirror circuits. Comparators 13 and 14 compare the source voltage of the main MOS 1 with the reference voltages Vref 1, Vref 2, respectively. The gates of the transistors 11 and 12 are coupled to the outputs of the comparator 13 and 14, respectively. When the source voltage (external load voltage VN2) of the main MOS 1 increases, the voltages of the inverting inputs of the comparators 13 and 14 increase. Transistors 11 and 12 are turned on when the voltages of the inverting inputs of comparators 13 and 14 rise above Vref 1, Vref 2, respectively. That is, the drain currents of the transistors 11 and 12 are currents determined by the sense current IS and the source voltage of the main MOS 1 (external load voltage VN2). Output current Iwat of the current generation circuit 5 is a combined current of the drain currents of the transistors 11 and 12. Therefore, the current Iwat becomes a current proportional to the sense current IS and the external load voltage VN2 (Iwat $\propto$ IS*VN2). In other words, Iwat is a current proportional to the power consumption of the external load.

Resistor-capacitor-network 15, as described above, corresponds to the thermal resistance and thermal capacitance of the external load. When the current Iwat proportional to the power consumption of the external load flows through the resistor-capacitor-network 15, a voltage corresponding to the external load temperature is generated at the node N1.

Overheat detection circuit (comparator) 16 compares the voltage of the node N1 with the reference voltage Vref, and outputs the comparison result as OT_DET signal. If the reference voltage Vref is previously set to a voltage for detecting the overheat condition of the external load, the overheat detection circuit 16 outputs a Hi-level signal upon detecting of overheat of the external load, and outputs a Low-level signal upon detecting of on-overheat of the external load.

The output OT_DET of the overheat detection circuit 16 is output to MCU 17, for example. MCU 17 performs control such as stopping the operation of the main MOS 1 when overheating of the external load is detected.

So far is the basic operation of the semiconductor device 100. Next, the operation of the switches SW1 to SW3 will be described. In a system including the semi-conductor device 100, switches SW1 to SW3 are used if an unintentional reset is performed during operation of the system.

Figure 2:
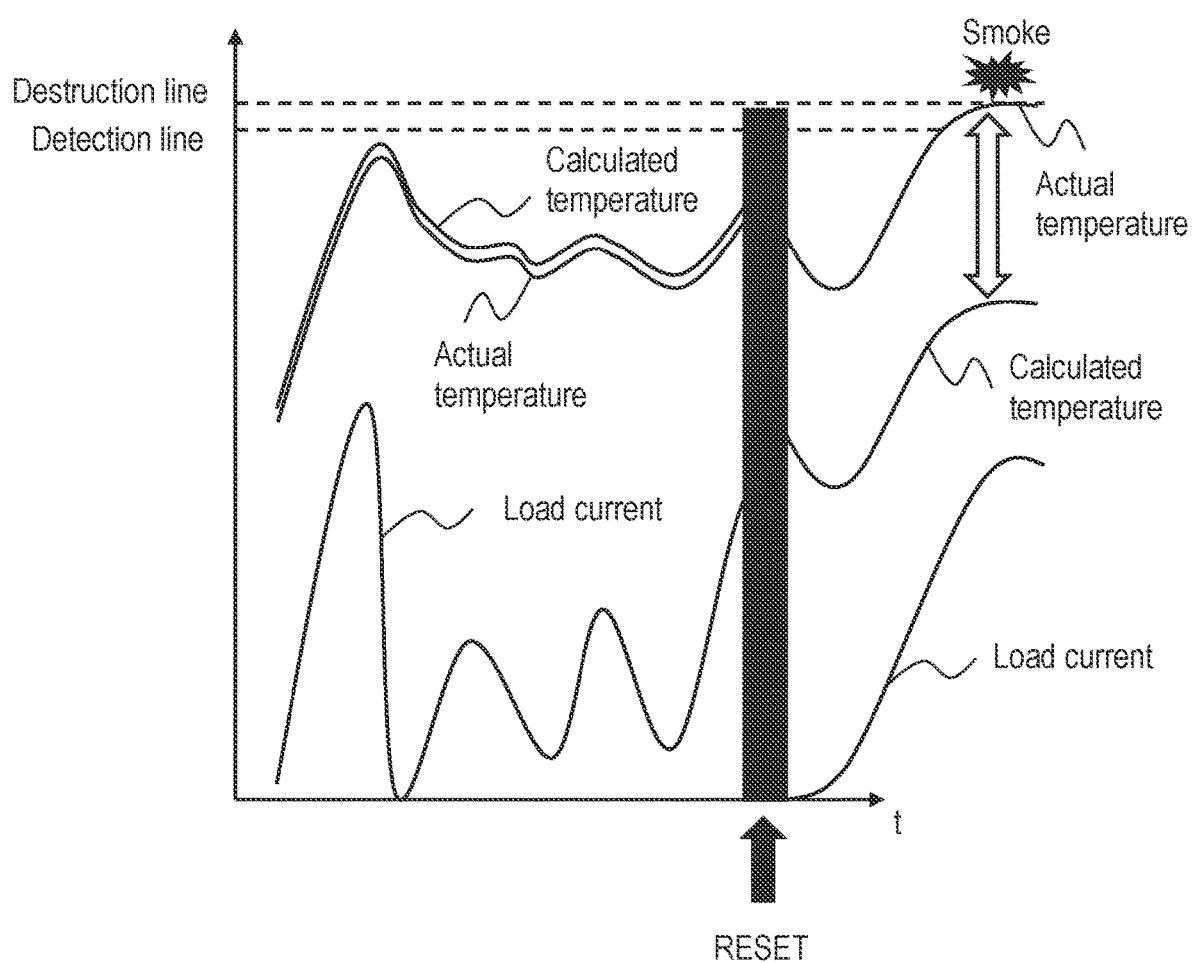
FIG. 2 is a diagram for explaining the operation of the semiconductor device according to the first embodiment.

Prior to describing the operation of the switches SW1 to SW3, FIG. 2 is used to describe the problems encountered when the unintentional reset is performed. The unintentional reset here is, for example, during system operation, a reset performed when the power supply voltage (VB) falls below the lower limit voltage. It is common practice to put the system into the reset state until the power supply voltage recovers to a normal state if the power supply voltage falls. In this embodiment, MCU 17 operates by a power supply voltage separate from the VB, controls the main MOS 1 (gate signal generation), monitors the VB, monitors the voltage of the node N1, controls the reset, and controls the switches SW1 to SW3.

In FIG. 2, "Calculated temperature" means the temperature corresponding to the voltage of node N1. "Actual temperature" means the actual temperatures of the external loads. When the power supply voltage drops during system operation and a reset is executed, the voltage of node N1 decreases according to a time constant determined by the thermal resistance and thermal capacitance (resistors R1, R2, R3, capacitors C1, C2, C3). Then, after the reset is released, the voltage of the node N1 rises according to the time constant. If the time constant is small, the voltage of the node N1 immediately follows the actual temperature of the external load after the reset is released. However, if the value of the time constant is large, after the reset release, the voltage of node N1 cannot follow immediately the actual temperature of the external load. Prior to the voltage of node N1 following the actual temperature of the external load, the actual temperature of the external load may reach the breakdown temperature (Destruction line) and the external load may be thermally destroyed. In this embodiment, since the setting the value of the thermal resistance and thermal capacitance to correspond to the external load including the wire harness, the time constant is increased. For example, the thermal resistance and thermal capacitance is larger than the thermal resistance and thermal capacitance inside the semiconductor device 100.

Therefore, in this embodiment, when the reset is executed, by turning on the switches SW1 to SW3, the voltage of the node N1 is controlled to be a predetermined voltage. The predetermined voltage, for example, a voltage corresponding to a saturation heat of the external load. The saturation heat is the maximum temperature at which an external load is not destroyed. Incidentally, the overheat detection circuit 16 detects an anomaly by comparing the voltage (Vref) corresponding to the saturation heat and the voltage of the node N1. Therefore, when the resistance values of the resistors R1, R2, and R3 are R1, R2, and R3, respectively, the voltage sources V1 to V3 become as follows.

$$V1=Vref$$

$$V2=Vref*(R2+R3)/(R1+R2+R3)$$

$$V3=Vref*R3/(R1+R2+R3)$$

Figure 3:
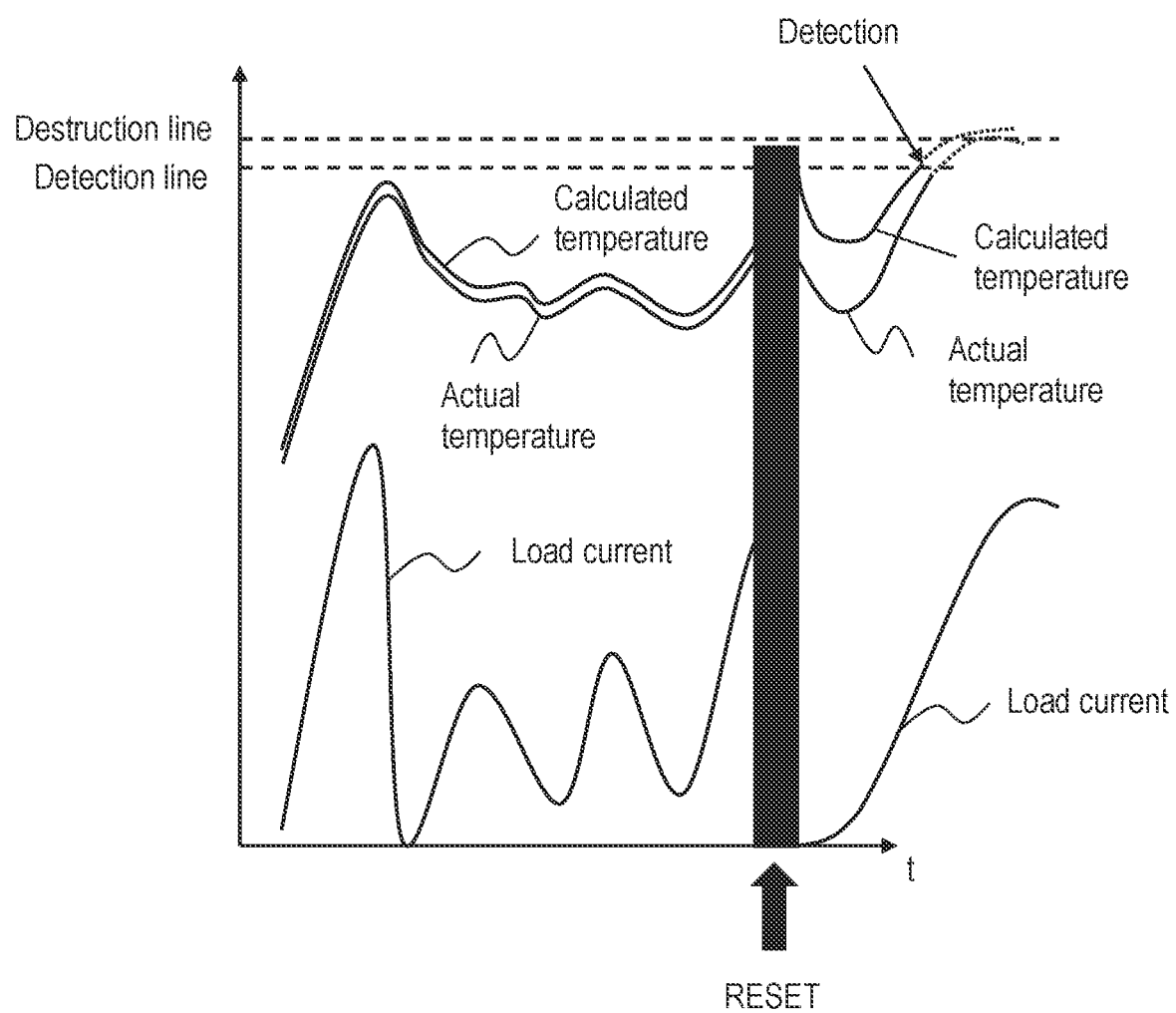
FIG. 3 is a diagram for explaining the operation of the semiconductor device according to the first embodiment.

FIG. 3 is a diagram for explaining the operation of the present embodiment. When the reset is performed, MCU 17 turns on the switches SW1 to SW3 to set the voltage of the node N1 to Vref. After releasing the reset, MCU 17 turns off the switches SW1 to SW3. Immediately after the reset is released, the voltage at node N1 indicates Vref, but the actual temperature of the external load becomes a temperature corresponding to the voltage below Vref. This is because, if the external load is less than or equal to the saturation heat before the reset, the external load is less than or equal to the saturation heat even after the reset due to heat dissipation during the reset period. Therefore, after the reset release, the voltage of the node N1 always indicates a temperature higher than the actual temperature of the external load (a voltage corresponding to a temperature higher than the actual temperature of the external load). When the temperature of the external load rises due to the operation after the reset is released, the voltage of the node N1 reaches the voltage (Vref) corresponding to the saturation heat before the external load reaches the saturation heat, thereby enabling abnormal detection before the external load is destroyed.

As described above, the semiconductor device 100 according to the first embodiment includes the current generation circuit 5 for outputting a current proportional to the power consumption of the external load including the wire harness and the resistor-capacitor-network 15 coupled to the current generation circuit 5. This enables high precision overheat detection of external load including wire harness.

Further, the semiconductor device 100 includes the switches SW1 to SW3 for controlling the voltage of the monitoring node (N1) of the resistor-capacitor-network 15 to a predetermined voltage when the reset is executed. As a result, even if an unintentional reset is performed, an anomaly can be detected before the external load is destroyed.

The present embodiment is not limited to the above, and various modifications can be made without departing from the gist thereof. For example, the current generation circuit generates the current Iwat with two transistors 11 and 12 but is not limited thereto. The current Iwat may be generated by three or more transistors. In this case, the second current mirror may output three or more currents, the three or more comparators may also be installed.

Further, the resistor-capacitor-network 15 includes the RC circuits of three stages, but may be two or less stages, or four or more stages. In this instance, the number of switches may also be increased or decreased.

When the reset period by MCU 17 is extremely short, the reset period may be extended to be equal to or longer than a predetermined period. By doing so, it is more reliable to detect an anomaly before the external load is destroyed.

Second Embodiment

Figure 4:
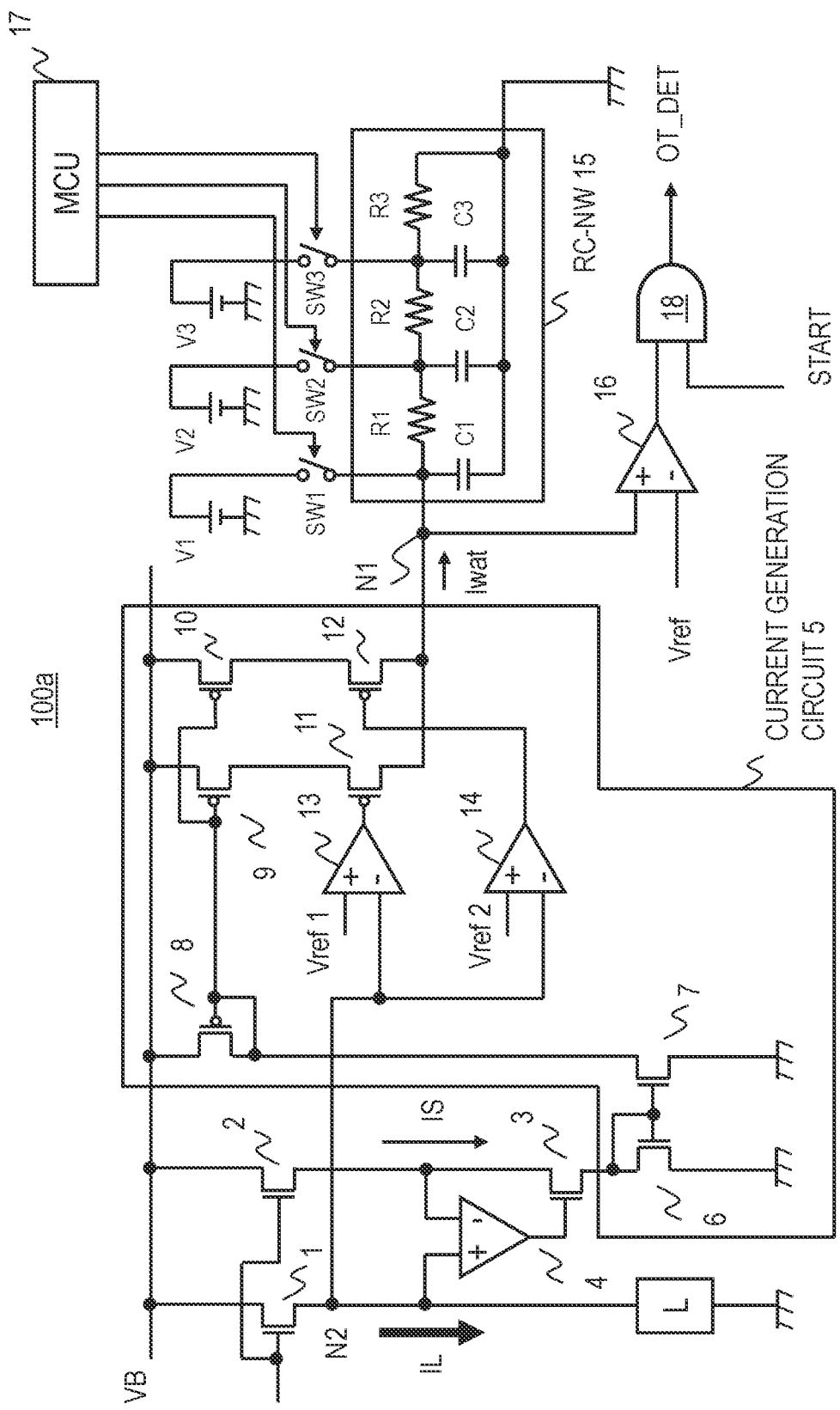
FIG. 4 is a circuit diagram of a semiconductor device according to a second embodiment.

FIG. 4 is a circuit diagram of a semiconductor device 100*a* according to the second embodiment. The difference from FIG. 1 is that the output fixing circuit (AND circuit) 18 is added.

The basic operation of the semiconductor device 100*a* is the same as that of the first embodiment. As described in the first embodiment, the voltage of the node N1 is set to Vref during the reset period. At this time, the overheat detection circuit (comparator) 16 will compare Vref with Vref, which may lead to false detection of the overheat condition. Therefore, in the second embodiment, during the reset period, the output signal OT_DET of the overheat detection circuit (comparator) 16 is fixed to Lo signal, which means non-overheat state, by setting START signal to Lo signal. Incidentally, START signal may be controlled by MCU 17.

As described above, in the semiconductor device 100*a* according to the second embodiment, in addition to the same effect as that of the first embodiment, it is possible to prevent erroneous detection of the overheated state during the reset period.

Third Embodiment

Figure 5:
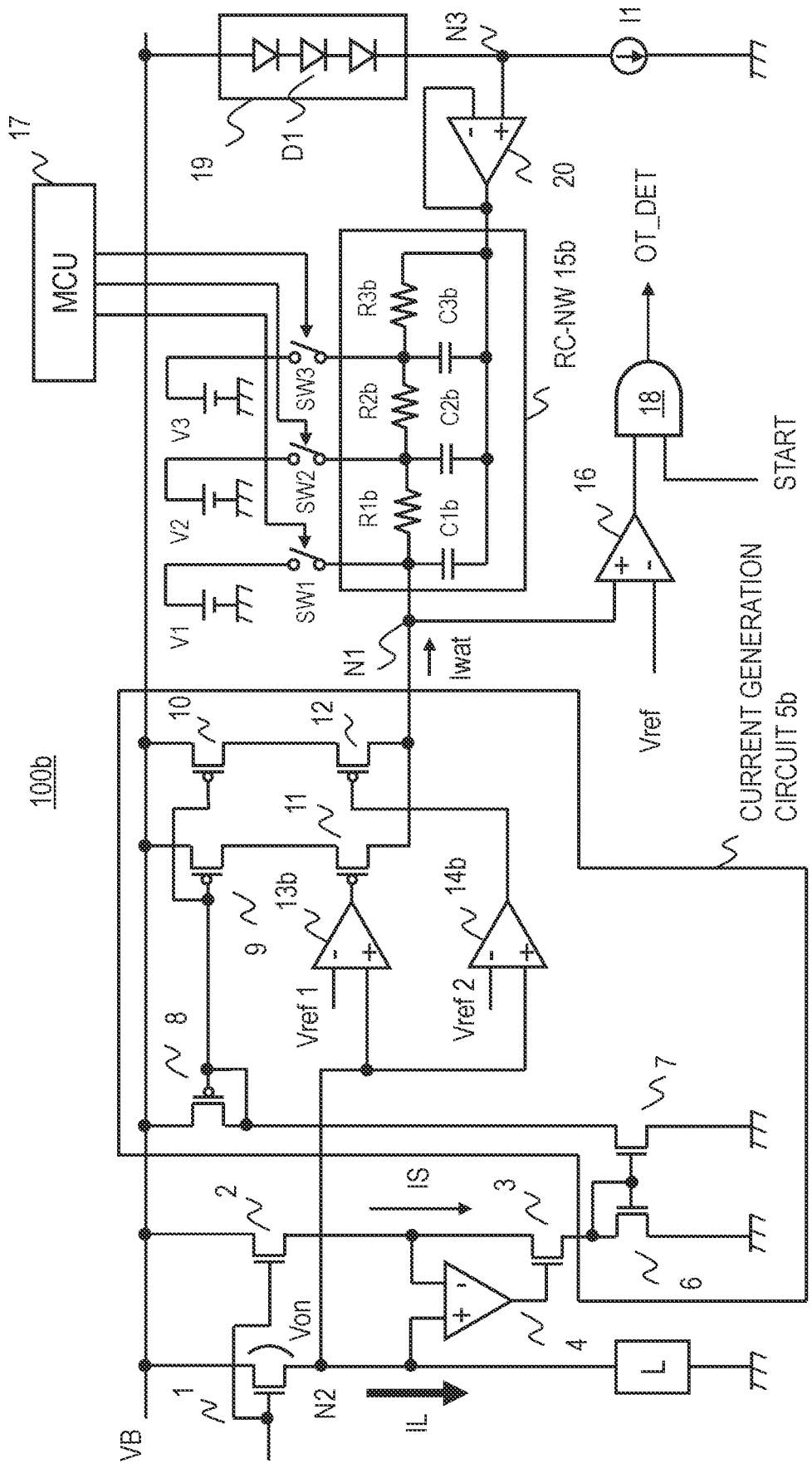
FIG. 5 is a circuit diagram of a semiconductor device according to a third embodiment.

FIG. 5 is a circuit diagram of a semiconductor device 100*b* according to the third embodiment. The difference from the first and second embodiments, that the configurations of the current generation circuit 5*b* and the resistor-capacitor-network 15*b* are different, a temperature sensor 19, a voltage follower circuit (differential amplifier) 20, a constant current source I1 are is added. In the first and second embodiments, the external load including the wire harness is subject to overheat detection. In the third embodiment, the inside of the semiconductor device 100*b* is an target of overheat detection.

In the semiconductor device using a power MOSFET, by installing a temperature sensor composed of a diode in the semiconductor device, it is performed to monitor the temperature of the power MOSFET. However, due to layout-related issues, it may not be possible to place the temperature sensor in the vicinity of the power MOSFET which becomes a high heat. In this case, it takes a delay time for the heat generated in the power MOSFET to be transferred to the temperature sensor, the accuracy of the temperature detection is lowered. For example, if the power MOSFET generates heat rapidly in a short time, since a temperature of the power MOSFET is higher than the temperature indicated by the temperature sensor, there is a possibility that the power MOSFET is destroyed when continuing the operation.

Therefore, in the third embodiment, overheat is detected by a resistor-capacitor-network corresponding to thermal resistance and thermal capacitance between the temperature sensor and the power MOSFET. Therefore, the resistor-capacitor-network 15b comprises resistors R1b, R2b, R3b and capacitors C1b, C2b, C3b corresponding to the thermal resistance and thermal capacitance between the temperature sensor 19 and the main MOS 1 in the semiconductor device 100b.

Further, the non-inverting inputs of the comparators 13b and 14b in the current generation circuit 5b are coupled to the source of the main MOS 1 (node N2). The inverting input of the comparator 13b is coupled to the reference voltage Vref 1. The inverting input of the comparator 14b is coupled to the reference voltage Vref 2.

The temperature sensor 19 is composed of n-stage diodes D1 connected in series. A constant current source I1 is coupled to the temperature sensor 19. A voltage follower circuit (differential amplifier) 20 is coupled to a connection node N3 of the temperature sensor 19 and the constant current source I1. An output of the voltage follower circuit 20 is coupled to the other end of the resistor-capacitor-network 15b.

Basic operation of the semiconductor device 100b is the same as in the first and second embodiments. However, the operations of the current generation circuit 5b and the resistor-capacitor-network 15b are different.

Similar to the first embodiment, the sense current IS becomes the drain currents of the transistors 9 and 10 by the first and second current mirror circuits. Unlike the first embodiment, the comparators 13b and 14b compare an on-voltage Von (Vds) of the main MOS 1 with the reference voltages Vref 1, Vref 2, respectively. When the on-voltage of the main MOS 1 rises, the voltages of the non-inverting inputs of the comparators 13 and 14 fall. Transistors 11 and 12 are turned on when the voltages of the non-inverting inputs of comparators 13 and 14 fall below Vref 1, Vref 2. Therefore, the drain currents of the transistors 11 and 12 become currents determined by the sense current IS and the on-voltage Von. Output current Iwat of the current generation circuit 5b is a combined current of the currents flowing through the transistors 11 and 12. The current Iwat becomes a current proportional to the sense current IS and the on-voltage Von of the main MOS 1, and Iwat ∝Von*IS. In other words, Iwat is a current proportional to the power consumption of the mains MOS 1.

Temperature sensor 19 is composed of an n-stage diodes D1. When a current flows by the constant current circuit I1, a voltage of the node N3 is VB−Vf*n (Vf is the forward voltage of the diode D1). Because Vf has a temperature dependence (about −2 mV/° C.), the voltage at node N3 varies according to the ambient temperature.

Resistor-capacitor-network 15b, as described above, corresponds to the thermal resistance and thermal capacitance between the main MOS 1 and the temperature sensor 19. Therefore, when the output current Iwat of the current generation circuit 5b flows to the resistor-capacitor-network 15b, a voltage corresponding to the temperature obtained by adding the ambient temperature and the temperature generated in the main MOS 1 is generated in the node N1.

Overheat detection circuit (comparator) 16 compares the is voltage of the node N1 and the reference voltage Vref, and outputs the comparison result as OT_DET signal. If the reference voltage Vref is previously set to a voltage for detecting an overheat condition of the main MOS 1, the overheat detection circuit 16 outputs a Hi-level signal upon detecting of overheat of the main MOS 1, and outputs a Low-level signal upon detecting of non-overheat of the main MOS 1.

Incidentally, since the switches SW1 to SW3, AND circuit 18 are the same as in the first and second embodiments, a detailed description thereof will be omitted.

As described above, in the semiconductor device 100b according to the third embodiment, the same effects as those in the first and second embodiments can be obtained with respect to the power MOSFET. Incidentally, as described above, the time constant inside the semiconductor device is smaller than the time constant of the external load. However, as the chip size increases, the third embodiment can also be expected to obtain an effect.

Fourth Embodiment

Figure 6:
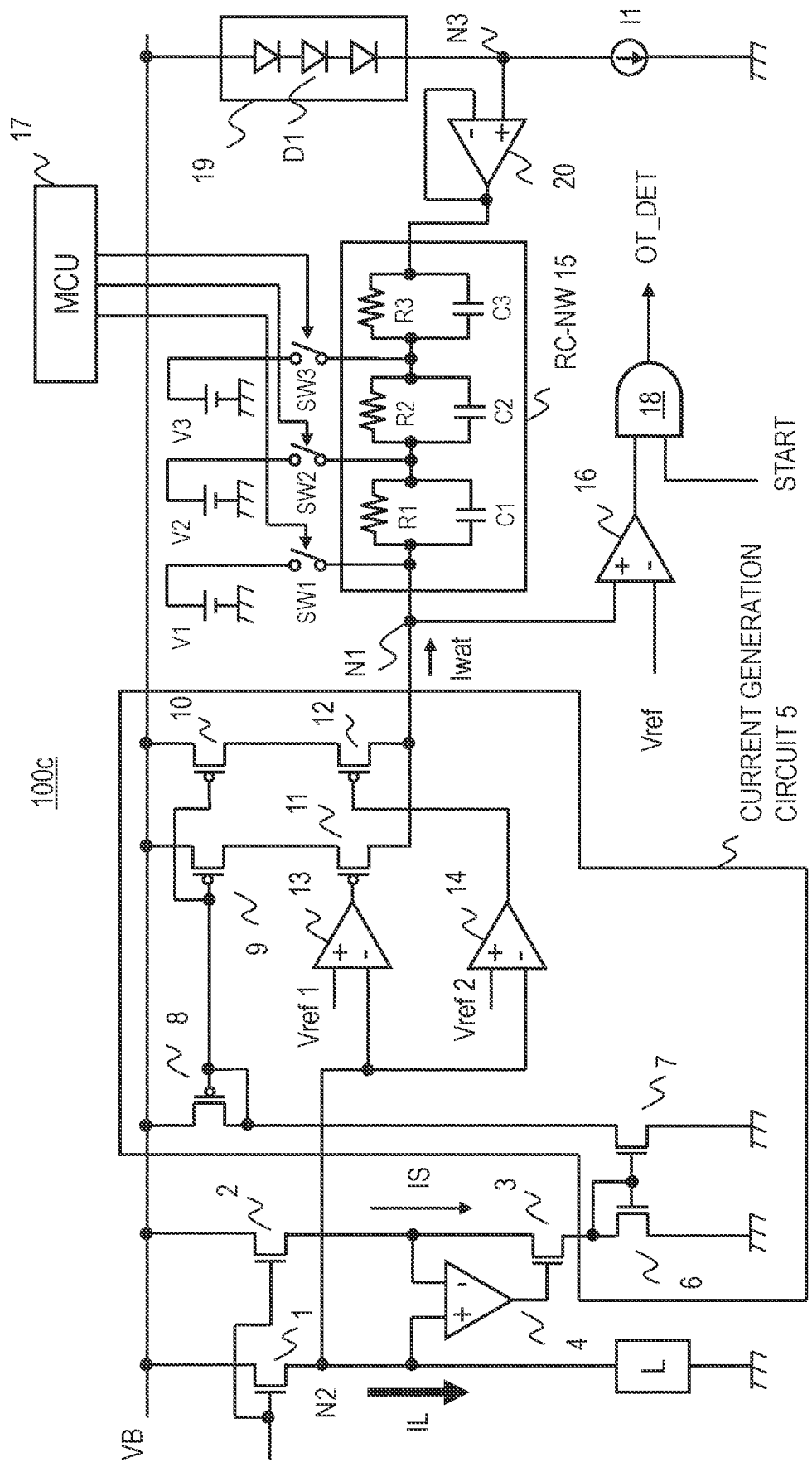
FIG. 6 is a circuit diagram of a semiconductor device according to a fourth embodiment.

FIG. 6 is a circuit diagram of a semiconductor device 100c according to the fourth embodiment. The difference from the third embodiment is a resistor-capacitor-network (RC-NW) 15. In the third embodiment, the resistor-capacitor-network (RC-NW) 15 has been constituted by the Cauer type equivalent circuit, in the fourth embodiment is constituted by the Foster type equivalent circuit. Compared with Cauer type equivalent circuit, Foster type equivalent circuit has the merit that it is not complicated and it is easy to calculate by the digital circuit. Since Foster equivalent circuit is generally known, their detailed descriptions are omitted.

As described above, in the semiconductor device 100c according to the fourth embodiment, the same effect as that of the third embodiment can be obtained. Note that Embodiment Mode 4 may be applied to Embodiments 1 and 2.

Fifth Embodiment

Figure 7:
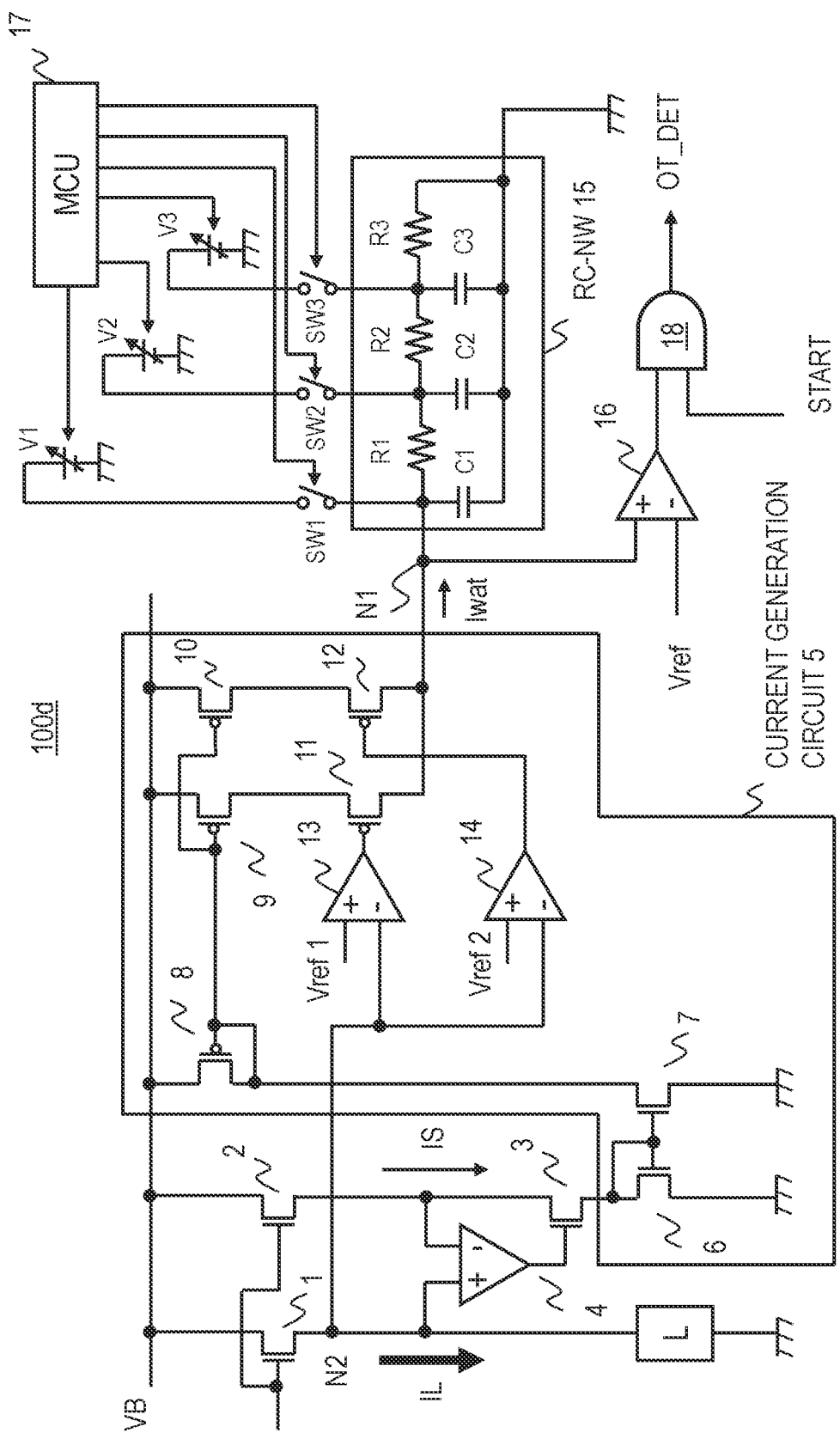
FIG. 7 is a circuit diagram of a semiconductor device according to a fifth embodiment.

FIG. 7 is a circuit diagram of a semiconductor device 100d according to the fifth embodiment. Difference from the first and second embodiments, the voltage sources V1, V2, V3 for generating predetermined voltages are changed to variable voltage sources.

The voltages of V1, V2 and V3 can be changed from MCU 17. For example, if an overheat detection with a margin to the breakdown temperature is desired, it can be realized by reducing the voltages of V1, V2, V3 and Vref.

As described above, in the semiconductor device 100d according to the fifth embodiment, in addition to the same effects as those of the first embodiment, it is possible to make the setting of the overheat detection variable.

Sixth Embodiment

Figure 8:
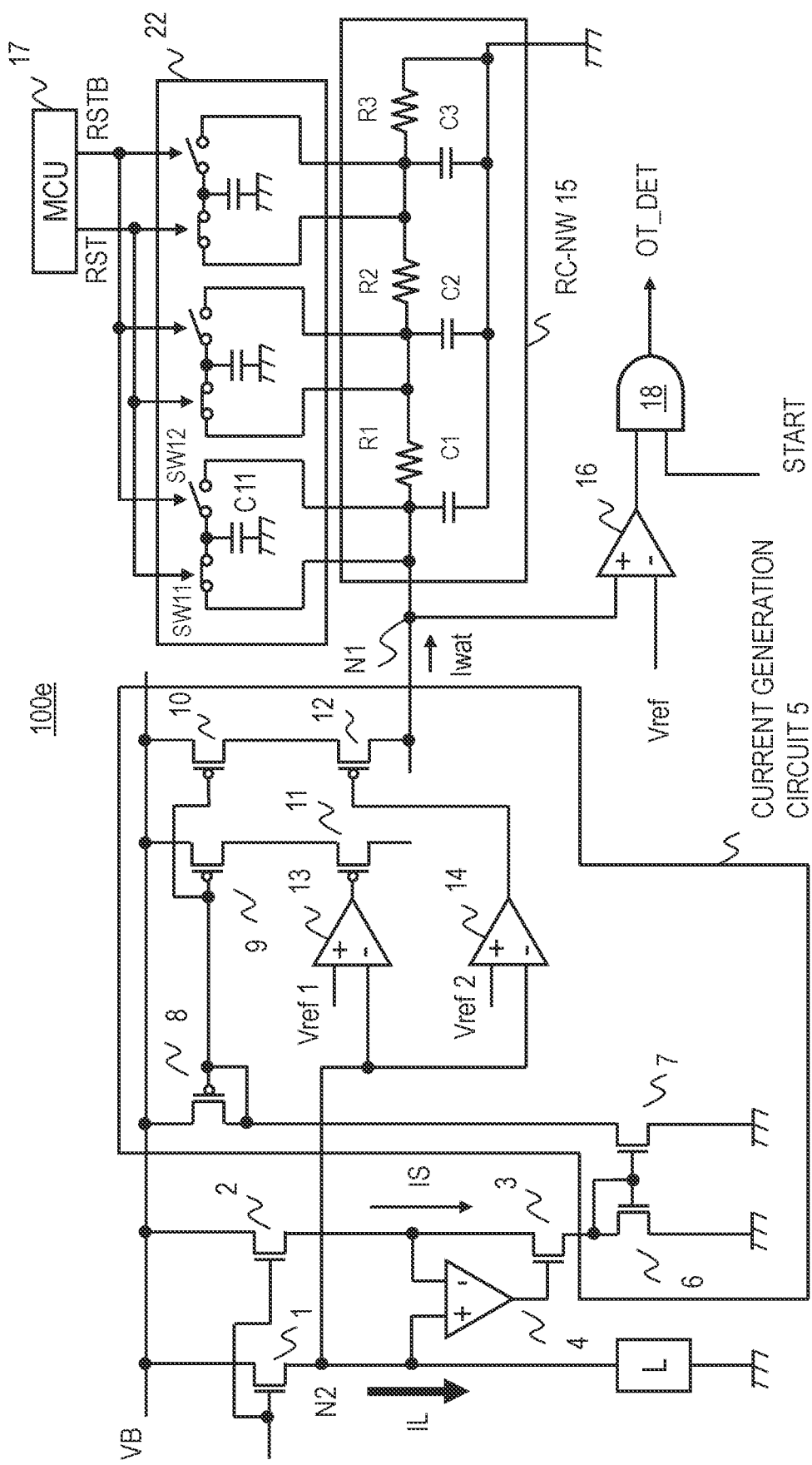
FIG. 8 is a circuit diagram of a semiconductor device according to a sixth embodiment.

FIG. 8 is a circuit diagram of a semiconductor device 100e according to the sixth embodiment. The difference from the first and second embodiments is that the voltage sources V1, V2, V3 is and the switches SW1, SW2, SW3 are replaced by the sample-and-hold circuit 22.

The basic operation of the semiconductor device 100e is the same as that of Embodiments 1 and 2. As described in Embodiments 1 and 2, the voltage of the node N1 is set to a predetermined voltage during the reset period. In the sixth embodiment, the predetermined voltage is obtained by sampling and holding the voltage of node N1 just before reset. In FIG. 8, since the resistor-capacitor-network 15 is composed of three stages of RC circuits, the sample-and-hold circuit having the same configuration is installed in each stage.

During normal operation, SW11 of the sample-and-hold circuit 22 is turned on and SW12 is turned off by RST/RSTB signals output from MCU 17. At this time, the sample-and-hold circuit 22 charges each capacitor C11 according to the voltage of each node including the node N1.

When a reset is performed from MCU 17, RST/RSTB signals are inverted, SW11 of the sample-and-hold circuit 22 is turned off, and SW12 is turned on. At this time, the sample-and-hold circuit 22 sets the voltage of each node including the node N1 to the voltage immediately before the reset by the capacitor C11 which is charged just before the reset.

As described above, in the semiconductor device 100e according to the sixth embodiment, even if the reset is performed, the voltage of the monitoring node N1 of the resistor-capacitor-network 15 can be set to the voltage immediately before the reset. As a result, even if an unintentional reset is performed, an anomaly can be detected before the external load is destroyed.

Figure 9:
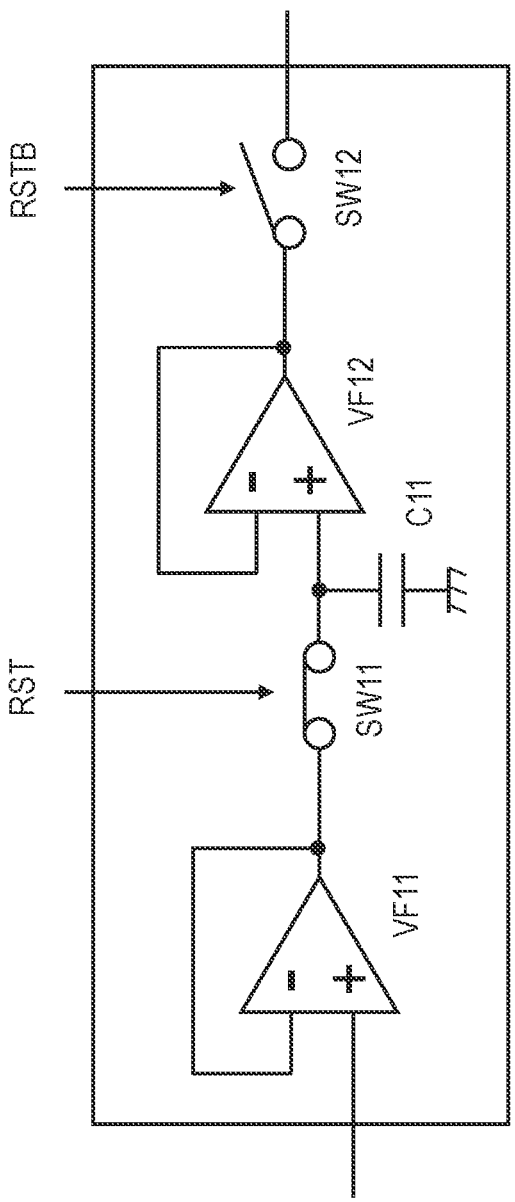
FIG. 9 is a circuit diagram of a sample and hold circuit according to the sixth embodiment.

The sample and hold circuit 22 may be configured as shown in FIG. 9. That is, the voltage follower circuits VF11, VF12 are coupled before and after the capacitor C11. The capacitance value of C 11 hardly affects the resistor-capacitor-network 15, and the accuracy of overheat detection is further improved.

Seventh Embodiment

Figure 10:
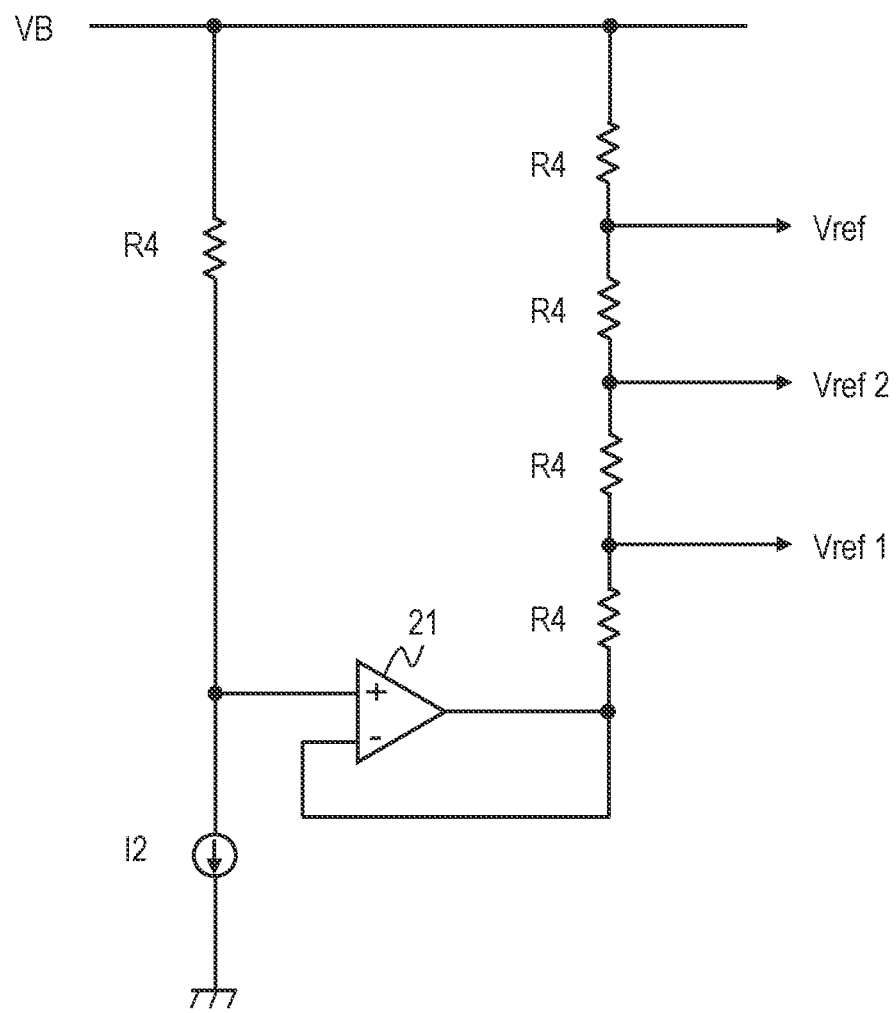
FIG. 10 is a circuit diagram of a reference voltage generating circuit.

FIG. 10 is a circuit diagram of a reference voltage generation circuit used in the first to sixth embodiments. As shown in FIG. 10, the reference voltage generation circuit has a differential amplifier 21, a resistor R4, a constant current source 12. The reference voltage generation circuit outputs voltages obtained by dividing a voltage between VB and the voltage generated by the differential amplifier 21 by the resistors R4 as the reference voltages Vref, Vref 1, Vref 2 That is, the reference voltages Vref, Vref 1, Vref 2 become a voltage with reference to the voltage VB. The resistors R4, all need not be the same resistance value.

When mounting the semiconductor device 100 in an automobile, the power supply voltage VB will be supplied from a battery. The voltage supplied from the battery is expected to fluctuate due to the state of charge of the battery, etc. When the voltage VB fluctuates, the voltages of the nodes N1, N2, N3 will also fluctuate. Therefore, in the fifth embodiment, since the reference voltages Vref, Vref 1, Vref 2 are generated with reference to VB, the reference voltages can follow the voltage variation.

As described above, in the seventh embodiment, in addition to the effects of the respective embodiments, it is possible to follow the variation of the power supply voltage.

It should be noted that the present invention is not limited to the above-mentioned embodiments, and various modifications can be made without departing from the gist thereof.

What is claimed is:

1. A semiconductor device, comprising:
    a first transistor that flows a load current to an external load;
    a second transistor coupled in parallel to the first transistor, and
    a current generation circuit that outputs a current corresponding to a power consumption generated in one of the external load and the first transistor, when the load current flows the one of the external load and the first transistor;
    a resistor-capacitor-network comprising a resistor and a capacitor corresponding to a thermal resistance and a thermal capacitance of the one of the external load and the first transistor, and having one end coupled to the current generation circuit;
    an overheat detection circuit coupled to a connection point of the current generation circuit and the resistor-capacitor-network; and
    a voltage source that sets a voltage of the connection point of the current generation circuit and the resistor-capacitor-network to a predetermined voltage,
    wherein the current generation circuit comprises:
        a current mirror circuit outputs, as a first and second output, a current corresponding to a current flowing through the second transistor;
        a third transistor that is coupled to the first output and is controlled in response to a source voltage of the first transistor; and
        a fourth transistor that is coupled to the second output and is controlled in response to a source voltage of the first transistor, and
    wherein a combined current of output currents of the third and fourth transistors is outputted as a current corresponding to the power consumption of the external load.

2. The semiconductor device according to claim 1, further comprising:
    a first switch coupled between the connection point of the current generation circuit and the resistor-capacitor-network and the voltage source.

3. The semiconductor device according to claim 2, wherein the first switch is controlled to be ON during a reset period of the semiconductor device.

4. The semiconductor device according to claim 1,
    wherein the voltage source is a sample-and-hold circuit, and
    wherein the sample-and-hold circuit holds the voltage of the connection point of the current generation circuit and the resistor-capacitor-network before a reset of the semiconductor device and sets the connection point to the hold voltage during a reset period.

5. The semiconductor device according to claim 3, further comprising:
    an output fixing circuit coupled to an output of the overheat detection circuit,
    wherein the output fixing circuit fixes the output of the overheat detection circuit to a predetermined value during the reset period.

6. The semiconductor device according to claim 3,
    wherein the external load includes a load and a wire harness coupled between the load and the semiconductor device,
    wherein the one of the external load and the first transistor is the external load, and
    wherein the resistor-capacitor-network comprises a resistor and capacitor corresponding to the thermal resistance and thermal capacitance of the external load.

7. The semiconductor device according to claim 3, further comprising:
    a temperature sensor,
    wherein the other end of the resistor-capacitor-network is coupled to the temperature sensor,
    wherein the one of the external load and the first transistor is the first transistor, and wherein the resistor-capacitor-network comprises a resistor and a capacitor corresponding to a thermal resistance and a thermal capacitance between the first transistor and the temperature sensor.

8. A semiconductor device comprising:
a first transistor that flows a load current to an external load;
a second transistor coupled in parallel to the first transistor;
a current generation circuit that outputs a current corresponding to a power consumption generated in one of the external load and the first transistor when the load current flows the one of the external load and the first transistor;
a resistor-capacitor-network comprising a resistor and a capacitor corresponding to a thermal resistance and a thermal capacitance of the one of the external load and the first transistor, and having one end coupled to the current generation circuit;
an overheat detection circuit coupled to a connection point of the current generation circuit and the resistor-capacitor-network; and
a voltage source that sets a voltage of the connection point of the current generation circuit and the resistor-capacitor-network to a predetermined voltage,
wherein the current generation circuit comprises;
    a current mirror circuit outputs, as a first and second output, a current corresponding to a current flowing through the second transistor;
    a third transistor that is coupled to the first output and is controlled in response to a drain-source voltage of the first transistor; and
    a fourth transistor that is coupled to the second output and is controlled in response to a drain-source voltage of the first transistor, and
wherein a combined current of output currents of the third and fourth transistors is outputted as a current corresponding to the power consumption of the first transistor.

9. The semiconductor device according to claim 1,
wherein the current generation circuit further comprises:
a first comparator coupled to a gate of the third transistor; and
a second comparator coupled to a gate of the fourth transistor,
wherein inverting inputs of the first and second comparators are coupled to a source of the first transistor,
wherein a non-inverting input of the first comparator is coupled to a first reference voltage,
wherein a non-inverting input of the second comparator is coupled to a second reference voltage.

10. The semiconductor device according to claim 8,
wherein the current generation circuit further comprises:
a first comparator coupled to a gate of the third transistor; and
a second comparator coupled to a gate of the fourth transistor,
wherein non-inverting inputs of the first and second comparators are coupled to a source of the first transistor,
wherein an inverting input of the first comparator is coupled to a first reference voltage,
wherein an inverting input of the second comparator is coupled to a second reference voltage.

11. The semiconductor device according to claim 1, further comprising:
a fifth transistor coupled between the current generation circuit and the second transistor; and
a differential amplifier coupled to a gate of the fifth transistor,
wherein a non-inverting input of the differential amplifier is coupled to a source of the first transistor,
wherein an inverting input of the differential amplifier is coupled to a source of the second transistor.

12. The semiconductor device according to claim 7, further comprising:
a constant current source coupled to the temperature sensor; and
a voltage follower circuit coupled to a connection point of the temperature sensor and the constant current source,
wherein the other end of the resistor-capacitor-network is coupled to the temperature sensor via the voltage follower circuit.

13. The semiconductor device according to claim 3,
wherein the overheat detection circuit includes a first comparator,
wherein a non-inverting input of the fs comparator is coupled to the connection point of the current generation circuit and the resistor-capacitor-network, and the inverting input thereof is coupled to a first reference voltage.

14. The semiconductor device according to claim 3,
wherein the resistor-capacitor-network is an equivalent circuit of Cauer type or Foster type comprises at least two stages of an RC circuit,
wherein the first switch is coupled to a first stage of the RC circuit, and
wherein a second switch is coupled to a second stage of the RC circuit.

15. A semiconductor device, comprising:
a first N-channel transistor that supplies a load current to an external load;
a second N-channel transistor coupled in parallel to the first N-channel transistor;
a third N-channel transistor whose drain is coupled to a source of the second N-channel transistor;
a differential amplifier whose non-inverting input is coupled to a source of the first N-channel transistor, whose inverting input is coupled to the source of the second N-channel transistor and whose output is coupled to a gate of the third N-channel transistor;
a current generation circuit that is coupled to a source of the third N-channel transistor and outputs a current corresponding to a power consumption generated in the external load;
a resistor-capacitor-network comprising a resistor and a capacitor corresponding to a thermal resistance and a thermal capacitance of the external load, and having one end coupled to the current generation circuit;
an overheat detection circuit coupled to a connection point of the current generation circuit and the resistor-capacitor-network;
a voltage source that sets a voltage of the connection point of the current generation circuit and the resistor-capacitor-network to a predetermined voltage; and
a first switch coupled between the connection point of the current generation circuit and the resistor-capacitor-network and the voltage source,
wherein the external load includes a load and a wire harness coupled between the load and the semiconductor device, and wherein the current generation circuit comprises:
a first current mirror circuit coupled to the source of the third N-channel transistor;
a second current mirror circuit coupled to the first current mirror circuit and having a first and second outputs;
a first P-channel transistor whose source is coupled to the first output of the second current mirror circuit and whose drain is coupled to the one end of the resistor-capacitor-network;
a second P-channel transistor whose source is coupled to the second output of the second current mirror circuit and whose drain is coupled to the one end of the resistor-capacitor-network;
a first comparator whose inverting input is coupled to the source of the first N-channel transistor, whose non-inverting input is coupled to a first reference voltage and whose output is coupled to a gate of the first P-channel transistor; and
a second comparator whose inverting input is coupled to the source of the first N-channel transistor, whose non-inverting input is coupled to a second reference voltage and whose output is coupled to a gate of the second P-channel transistor.

16. The semiconductor device according to claim 15, wherein the first switch is controlled to be ON during a reset period of the semiconductor device.

17. A semiconductor device comprising:
a first N-channel transistor that supplies a load current to an external load;
a second N-channel transistor coupled in parallel to the first N-channel transistor;
a third N-channel transistor whose drain is coupled to a source of the second N-channel transistor;
a differential amplifier whose non-inverting input is coupled to a source of the first N-channel transistor, whose inverting input is coupled to the source of the second N-channel transistor and whose output is coupled to a gate of the third N-channel transistor;
a current generation circuit that is coupled to a source of the third N-channel transistor and outputs a current corresponding to a power consumption generated in the first N-channel transistor;
a temperature sensor;
a constant current source coupled to the temperature sensor;
a voltage follower circuit coupled to a connection point of the temperature sensor and the constant current source;
a resistor-capacitor-network that is coupled between the current generation circuit and the voltage follower circuit and includes a resistor and a capacitor corresponding to a thermal resistance and a thermal capacitance between the first N-channel transistor and the temperature sensor;
an overheat detection circuit coupled to a connection point of the current generation circuit and the resistor-capacitor-network;
a voltage source that sets a voltage of the connection point of the current generation circuit and the resistor-capacitor-network to a predetermined voltage; and
a first switch coupled between the connection point of the current generation circuit and the resistor-capacitor-network and the voltage source,
wherein the detection target is the first N-channel transistor,
wherein the current generation circuit comprises:
a first current mirror circuit coupled to the source of the third N-channel transistor;
a second current mirror circuit coupled to the first current mirror circuit and having a first and second outputs;
a first P-channel transistor whose source is coupled to the first output of the second current mirror circuit and whose drain is coupled to one end of the resistor-capacitor-network;
a second P-channel transistor whose source is coupled to the second output of the second a current mirror circuit and whose drain is coupled to one end of the resistor-capacitor-network;
a first comparator whose non-inverting input is coupled to the source of the first N-channel transistor, whose inverting input is coupled to a first reference voltage and whose output is coupled to a gate of the first P-channel transistor; and
a second comparator whose non-inverting input is coupled to the source of the first N-channel transistor, whose inverting input is coupled to a second reference voltage and whose output is coupled to a gate of the second P-channel transistor.

18. The semiconductor device according to claim 15, wherein the resistor-capacitor-network is an equivalent circuit of Cauer type or Foster type comprises at least two stages of an RC circuit,
wherein the first switch is coupled to a first stage of the RC circuit, and
wherein a second switch is coupled to a second stage of the RC circuit.

* * * * *